(12) United States Patent
Templier et al.

(10) Patent No.: US 11,133,437 B2
(45) Date of Patent: Sep. 28, 2021

(54) OPTOELECTRONIC DEVICE WITH LIGHT-EMITTING DIODE WITH EXTRACTION ENHANCEMENT

(71) Applicant: Commissariat à l'Énergie Atomique et aux Énergies Alternatives, Paris (FR)

(72) Inventors: François Templier, Grenoble (FR); Salim Boutami, Grenoble (FR)

(73) Assignee: Commissariat à l'Énergie Atomique et aux Énergies Alternatives, Paris (FR)

(*) Notice: Subject to any disclaimer, the term of this patent is extended or adjusted under 35 U.S.C. 154(b) by 0 days.

(21) Appl. No.: 16/465,723

(22) PCT Filed: Nov. 30, 2017

(86) PCT No.: PCT/FR2017/053292
§ 371 (c)(1),
(2) Date: May 31, 2019

(87) PCT Pub. No.: WO2018/100294
PCT Pub. Date: Jun. 7, 2018

(65) Prior Publication Data
US 2019/0305198 A1    Oct. 3, 2019

(30) Foreign Application Priority Data
Dec. 2, 2016   (FR) ...................................... 1661877

(51) Int. Cl.
*H01L 33/60*   (2010.01)
*H01L 33/08*   (2010.01)
*H01L 33/20*   (2010.01)

(52) U.S. Cl.
CPC .............. *H01L 33/20* (2013.01); *H01L 33/08* (2013.01); *H01L 33/60* (2013.01); *H01L 2924/12041* (2013.01); *H01L 2933/0083* (2013.01)

(58) Field of Classification Search
CPC ......... H01L 33/20; H01L 33/08; H01L 33/60; H01L 2924/12041; H01L 2933/0083
See application file for complete search history.

(56) References Cited

U.S. PATENT DOCUMENTS 5,779,924 A * 7/1998 Krames ................... H01L 33/20
                                                                216/24
2006/0192217 A1   8/2006 David et al.
(Continued)

FOREIGN PATENT DOCUMENTS

EP         0 977 280 A2    2/2000
WO       WO 02/089218 A2   11/2002
WO       WO 2008/079079 A1  7/2008

OTHER PUBLICATIONS

International Preliminary Report on Patentability for International Application No. PCT/FR2017/053292, dated Jun. 13, 2019.
(Continued)

*Primary Examiner* — Cuong B Nguyen
(74) *Attorney, Agent, or Firm* — Wolf, Greenfield & Sacks, P.C.

(57) ABSTRACT

An optoelectronic device including an active area capable of supplying an electromagnetic radiation and sandwiched between first and second semiconductor layers, the first semiconductor layer delimiting a surface and including a first portion in contact with the active area and delimiting a first part of the surface and extending in a second portion delimiting a second part of the surface, the second portion forming a single-mode waveguide, the optoelectronic device including an opaque portion reflective for the electromag-
(Continued)

netic radiation covering the first part and including a diffraction grating on the second part capable of extracting the electromagnetic radiation from the second portion.

13 Claims, 11 Drawing Sheets

(56) References Cited

U.S. PATENT DOCUMENTS

| | | |
|---|---|---|
| 2007/0262330 A1 | 11/2007 | Lee et al. |
| 2008/0258160 A1 | 10/2008 | Do |
| 2008/0303419 A1 | 12/2008 | Fukuda |
| 2009/0050905 A1 | 2/2009 | Abu-Ageel |
| 2011/0024781 A1* | 2/2011 | Fujimoto ............... H01L 33/20 257/98 |
| 2015/0228931 A1 | 8/2015 | Lamansky et al. |

OTHER PUBLICATIONS

International Search Report and Written Opinion for International Application No. PCT/FR2017/053292, dated Feb. 22, 2018.
PCT/FR2017/053292, Feb. 22, 2018, International Search Report and Written Opinion.
PCT/FR2017/053292, Jun. 13, 2019, International Preliminary Report on Patentability.

* cited by examiner

OPTOELECTRONIC DEVICE WITH LIGHT-EMITTING DIODE WITH EXTRACTION ENHANCEMENT

This patent application is a national stage filing under 35 U.S.C. 371 of International Patent Application Serial No. PCT/FR2017/053292, filed Nov. 30, 2017, which claims the priority to French patent application FR16/61877, filed Dec. 2, 2016. The entire contents of these applications are incorporated herein by reference in their entireties.

BACKGROUND

The present invention generally relates to opto-electronic devices made up of semiconductor materials and to methods of manufacturing the same. The present invention more specifically relates to optoelectronic devices comprising light-emitting diodes.

DISCUSSION OF THE RELATED ART

Phrase "optoelectronic devices comprising light-emitting diodes" designates devices capable of converting an electric signal into an electromagnetic radiation, and particularly devices dedicated to emitting an electromagnetic radiation, particularly light.

Generally, the optoelectronic device comprises at least one light-emitting diode formed by a stack of semiconductor layers. The active area is the area of the light-emitting diode from which most of the radiation delivered by light-emitting diode DEL is emitted. The active area may comprise confinement means. As an example, the active area may comprise a single quantum well or multiple quantum wells.

The extraction efficiency of an optoelectronic device is generally defined by the ratio of the number of photons coming out of the optoelectronic device to the number of photons emitted by the active area of the device. It is desirable for the extraction efficiency of an optoelectronic device to be as high as possible. However, part of the radiation may remain trapped in the optoelectronic device.

FIG. 1 is a partial simplified cross-section view of an embodiment of an optoelectronic device 10 comprising a light-emitting diode. As an example, optoelectronic device 10 may have a structure having a symmetry of revolution. Optoelectronic device 10 comprises a stack 12 of semiconductor layers, for example, mainly comprising an alloy of a group-III element and of a group-V element, for example, GaN. The stack may comprise a P-type doped semiconductor layer 14, an N-type doped semiconductor layer 16, and an active area 18 sandwiched between semiconductor layers 14 and 16. Semiconductor layer 16 comprises a surface 20, called transmission surface, having the electromagnetic radiation emitted by active area 18 coming out of it. Call Z the direction perpendicular to surface 20.

Optoelectronic device 10 further comprises an electrically-conductive pad 22 in contact with semiconductor layer 14 and an electrically-conductive pad 24 in contact with semiconductor layer 16. Optoelectronic device 10 further comprises an electrically-insulating portion 26 separating conductive pad 24 from conductive pad 22, from semiconductor layer 14, and from active area 18. Conductive pads 22, 24 enable to power the light-emitting diode for the emission of an electromagnetic radiation.

Part of the electromagnetic radiation directly comes out of transmission surface 20 without for the electromagnetic waves to reflect on the walls of optoelectronic device 10. This propagation mode of the electromagnetic radiation is called direct radiation mode and is schematically shown in FIG. 1 by wavefronts 27. The directivity of optoelectronic device 10 corresponds to the proportion of the radiation which comes out of transmission surface 20 along the same direction. The larger this proportion, the more directional the optoelectronic device. The light rays of the direct radiation mode are substantially orthogonal to transmission surface 20 so that optoelectronic device 10 is directional when only the direct radiation mode is present.

Part of the electromagnetic radiation reflects on the walls of optoelectronic device 10 along different paths. Such propagation modes are called guided modes. Guided modes are schematically shown in FIG. 1 by radiuses 28 which reflect on walls of optoelectronic device 10. At least part of the electromagnetic radiation which propagates along guided modes may remain trapped in optoelectronic device 10.

It is known to form a periodic diffraction grating on transmission surface 20 to increase the extraction efficiency of optoelectronic device 10. A diffraction grating for example comprises regularly spaced apart rectilinear or circular grooves formed in transmission surface 20. The diffraction grating enables to extract the radiation propagating through semiconductor layer 16 along guided modes.

However, a disadvantage of the periodic diffraction grating is that it alters the directivity of optoelectronic device 10. Indeed, the direction in which the radiation is transmitted by the diffraction grating depends on the guided mode. The thickness of semiconductor layer 16 may be greater than a few micrometers so that optoelectronic device 10 generally has many guided modes which are extracted by the periodic diffraction grating according to different transmission directions.

SUMMARY

An object of an embodiment is to overcome all or part of the disadvantages of the previously-described optoelectronic devices.

Another object of an embodiment is to increase the extraction efficiency of the optoelectronic device.

Another object of an embodiment is to increase the directivity of the optoelectronic device.

Thus, an embodiment provides an optoelectronic device comprising an active area capable of supplying an electromagnetic radiation and sandwiched between first and second semiconductor layers, the first semiconductor layer delimiting a surface and comprising a first portion in contact with the active area and delimiting a first part of the surface and being continued by a second portion delimiting a second part of the surface, the second portion forming a single-mode waveguide, the optoelectronic device comprising an opaque portion which is reflective for electromagnetic radiation, covering the first part, and comprising a diffraction grating in the second part capable of extracting the electromagnetic radiation from the second portion.

According to an embodiment, the diffraction grating is capable of extracting the electromagnetic radiation from the second portion along a direction inclined by more than 10° relative to the direction perpendicular to the first part.

According to an embodiment, the thickness of the second portion is in the range from 0.05 µm to 0.2 µm.

According to an embodiment, the thickness of the first portion is greater than the thickness of the second portion.

According to an embodiment, the lateral dimension of the second portion is greater than the wavelength of said electromagnetic radiation.

According to an embodiment, the diffraction grating comprises rings.

According to an embodiment, the rings are circular.

According to an embodiment, the rings are not circular.

According to an embodiment, the rings have the shape of ellipses having a common focus and having the same major axis.

According to an embodiment, the device further comprises a layer of a material at least partly transparent to said electromagnetic radiation, covering at least the diffraction grating and having a refractive index at the wavelength of said electromagnetic radiation in the range from the refractive index of the first semiconductor layer at the wavelength of said electromagnetic radiation to the refractive index of air at the wavelength of said electromagnetic radiation.

According to an embodiment, thickness h of the second portion verifies the following relation:

$$h < \frac{2\lambda}{\sqrt[3]{n_{GaN}^2 - n_{superstrat}^2}} \quad (I)$$

where $n_{GaN}$ is the refractive index, at the wavelength of the electromagnetic radiation emitted by the active area, of the material forming the second portion and $n_{superstrat}$ is the refractive index, at the wavelength of the electromagnetic radiation emitted by the active area, of the material in contact with the second portion by the second part of the surface.

An embodiment also provides a method of manufacturing an optoelectronic device comprising an active area capable of supplying an electromagnetic radiation, sandwiched between first and second semiconductor layers, the first semiconductor layer delimiting a surface, the method comprising the steps of:

a) forming, in the first semiconductor layer, a first part in contact with the active area and delimiting a first portion of the surface and extending in a second portion delimiting a second part of the surface, the second portion forming a single-mode waveguide;

b) forming a portion opaque for the electromagnetic radiation, covering the first part; and c) forming a diffraction grating in the second part capable of extracting the electromagnetic radiation from the second portion.

According to an embodiment, step a) comprises forming a semiconductor stack and delimiting, in the stack, the active area, the first portion, and the second portion by implantation of materials in the stack to locally degrade the stack.

The foregoing and other features and advantages will be discussed in detail in the following non-limiting description of specific embodiments in connection with the accompanying drawings.

DETAILED DESCRIPTION

Figure 1:
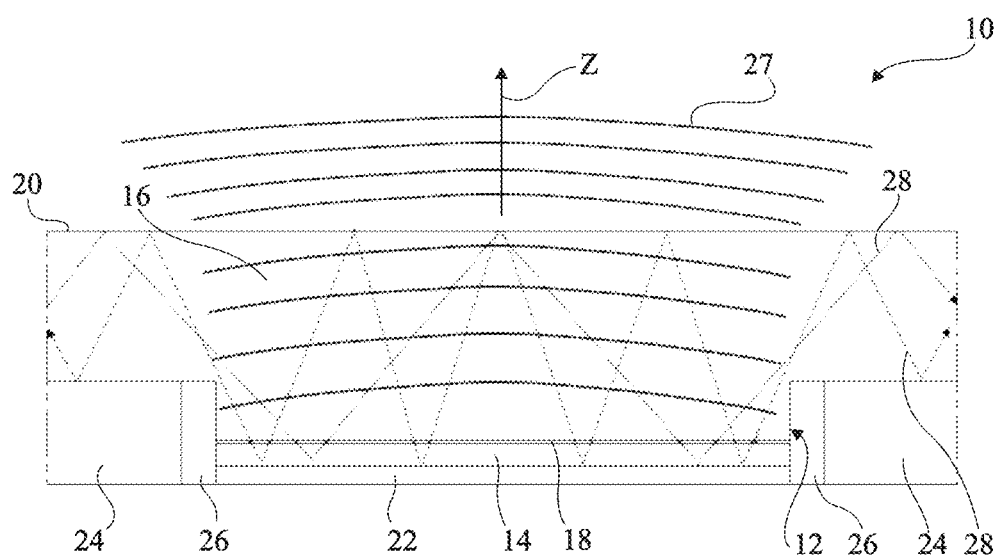
FIG. 1, previously described, is a partial simplified cross-section view of an example of an optoelectronic device comprising a light-emitting diode.

The same elements have been designated with the same reference numerals in the different drawings. For clarity, only those steps and elements which are useful to the understanding of the described embodiments have been shown and are detailed. In particular, the structure of the active area of a light-emitting diode is well known by those skilled in the art and is not described in detail hereafter. Unless otherwise specified, expressions "approximately", "substantially", and "in the order of" mean to within 10%, preferably to within 5%.

Figure 2:
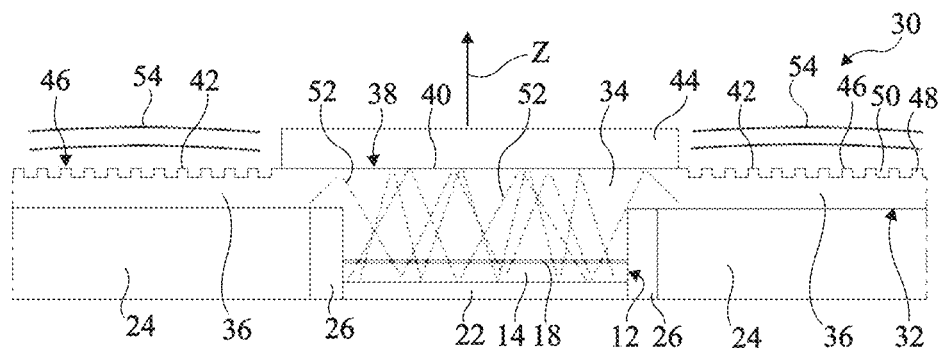
FIG. 2 is a partial simplified cross-section view of an embodiment of an optoelectronic device comprising a light-emitting diode.

FIG. 2 is a partial simplified cross-section view of an embodiment of an optoelectronic device 30 comprising a light-emitting diode.

Optoelectronic device 30 comprises all the elements of optoelectronic device 10 shown in FIG. 1, with the difference that semiconductor layer 16 is replaced with a semiconductor layer 32 comprising a first portion 34 in contact with active area 18 and continued by a second thinner portion 36. According to an embodiment, semiconductor layer 32 is doped with the conductivity type opposite to that of semiconductor layer 14. Semiconductor layer 32 may be formed by a stack of at least two semiconductor layers having, for example, different dopant concentrations. In the present embodiment, second portion 36 extends at the periphery of first portion 34 so that first portion 34 is called central portion and second portion 36 is called peripheral portion.

Semiconductor layer 32 comprises a front surface 38 on the side opposite to active area 18. Front surface 38 divides into a central part 40 of front surface 38 opposite central portion 34 of semiconductor layer 32 and a peripheral part 42 of front surface 38 opposite peripheral portion 36 of semiconductor layer 32. In the present embodiment, peripheral part 42 of front surface 38 is in contact with air.

The thickness of central portion 34 may be greater than a few micrometers, for example, in the range from 1 μm to 10 μm. The thickness of peripheral portion 36 is smaller than 0.2 μm, for example, in the range from 0.05 μm to 0.2 μm. The radial dimension of peripheral portion 36, measured perpendicularly to direction Z, is greater than the wavelength of the electromagnetic radiation and is preferably in the range from 1 μm to 100 μm. The thickness of peripheral portion 36 is determined so that the radiation can propagate through peripheral portion 36 along a single propagation mode. Peripheral portion 36 then corresponds to a single-mode waveguide.

Figure 7:
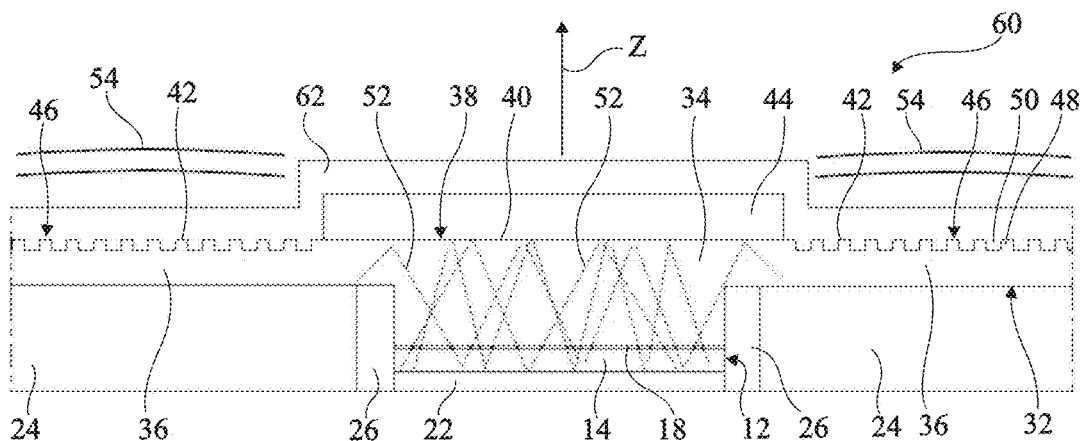
FIG. 7 is a partial simplified cross-section view of another embodiment of an optoelectronic device comprising a light-emitting diode.

According to an embodiment, to ascertain that the radiation propagates in peripheral portion 36 according to a single propagation mode, thickness h of peripheral portion 36 is smaller than a maximum thickness according to the following relation (I):

$$h < \frac{2\lambda}{\sqrt[3]{n_{GaN}^2 - n_{superstrat}^2}} \quad (I)$$

where $n_{GaN}$ is the refractive index of the material forming peripheral portion 36 at the wavelength of the electromagnetic radiation emitted by active area 18 and $n_{superstrat}$ is the refractive index of the material in contact with peripheral portion 36 by peripheral part 42 of front surface 38 at the wavelength of the electromagnetic radiation emitted by active area 18, for example, air in the embodiment shown in FIG. 2 or another material as described hereafter in relation with FIG. 7.

Optoelectronic device 30 further comprises a substantially opaque portion 44 which is reflective for the radiation emitted by active area 18, and covering central part 40, for example, planar, of front surface 38. In particular, reflective opaque portion 44 is not present on peripheral part 42 of front surface 38. The thickness of portion 44 is greater than the skin depth at the wavelength of the radiation emitted by active area 18. According to an embodiment, the thickness of portion 44 is greater than 50 nm, for example, in the range from 50 nm to 2,000 nm. As an example, portion 44 is a metal portion, for example, made of silver or aluminum, having a thickness greater than 50 nm to be opaque at the 405-nm wavelength. Opaque portion 44 covers substantially the entire active area 18. If active area 18 has a circular cross-section in a plane perpendicular to direction Z, opaque portion 44 may have a circular cross-section in a plane perpendicular to direction Z having a diameter equal to or greater than that of active area 18. If active area 18 has a square cross-section in a plane perpendicular to direction Z, opaque portion 44 may have a circular cross-section in a plane perpendicular to direction Z, the square cross-section of active area 18 then being inscribed within the circular cross-section of active area 18, or may have a square cross-section in a plane perpendicular to direction Z of same dimensions or larger than the square cross-section of active area 18.

Optoelectronic device 30 further comprises a diffraction grating 46 formed on peripheral part 42 of front surface 38. Diffraction grating 46 comprises raised portions 48 and recessed portions 50.

According to an embodiment, the semiconductor layers of stack 12 are at least partly formed from at least one semiconductor material adapted to the forming of a light-emitting diode, particularly a semiconductor material selected from the group comprising III-V compounds, II-VI compounds, or group-IV semiconductors or compounds.

The semiconductor layers of stack 12 may be at least partly formed from semiconductor materials mainly comprising a III-V compound, for example, a III-N compound. Examples of group-III elements comprise gallium (Ga), indium (In), or aluminum (Al). Examples of III-N compounds are GaN, AN, InN, InGaN, AlGaN, or AlInGaN. Other group-V elements may also be used, for example, phosphorus or arsenic. Generally, the elements in the III-V compound may be combined with different molar fractions.

The semiconductor layers of stack 12 may be at least partly formed from semiconductor materials mainly comprising a II-VI compound. Examples of group-II elements comprise group-IIA elements, particularly beryllium (Be) and magnesium (Mg), and group-IIB elements, particularly zinc (Zn), cadmium (Cd), and mercury (Hg). Examples of group-VI elements comprise group-VIA elements, particularly oxygen (O) and tellurium (Te). Examples of II-VI compounds are ZnO, ZnMgO, CdZnO, CdZnMgO, CdHgTe, CdTe, or HgTe. Generally, the elements in the II-VI compound may be combined with different molar fractions.

The semiconductor layers of stack 12 may be at least partly formed from semiconductor materials mainly comprising at least one group-IV compound. Examples of group-IV semiconductor materials are silicon (Si), carbon (C), germanium (Ge), silicon carbide alloys (SiC), silicon-germanium alloys (SiGe), or germanium carbide alloys (GeC).

The semiconductor layers of stack 12 may comprise a dopant. As an example, for III-V compounds, the dopant may be selected from the group comprising a P-type group-II dopant, for example, magnesium (Mg), zinc (Zn), cadmium (Cd), or mercury (Hg), a P-type group-IV dopant, for example, carbon (C) or an N-type group-IV dopant, for example, silicon (Si), germanium (Ge), selenium (Se), sulfur (S), terbium (Tb), or tin (Sn).

Active area 18 may comprise confinement means. As an example, active area 18 may comprise a single quantum well. It then comprises a semiconductor material different from the semiconductor material forming semiconductor layers 14 and 32 and having a bandgap smaller than that of the material forming semiconductor layers 14 and 32. Active area 18 may comprise multiple quantum wells. It then comprises a stack of semiconductor layers forming an alternation of quantum wells and of barrier layers.

The thickness of semiconductor layer 14 may be in the range from 0.1 μm to 0.3 μm, for example, approximately 0.2 μm. The thickness of active area 18 may be in the range from 5 nm to 300 nm, for example, approximately 0.2 μm.

Each conductive pad 22, 24 may correspond to a conductive layer, for example, metallic, or to a stack of at least two conductive layers, for example, metallic. The material forming each conductive pad 22, 24 is, for example, nickel silicide (NiSi), aluminum (Al), aluminum silicide (AlSi), titanium (Ti), or titanium silicide (TiSi). Layer 44 may replace or complete pad 24 as a cathode of the light-emitting diode.

Insulating portion 26 may be made of a dielectric material, for example, of silicon oxide ($SiO_2$), of silicon nitride ($Si_xN_y$, where x is approximately equal to 3 and y is approximately equal to 4, for example, $Si_3N_4$), of silicon oxynitride (particularly of general formula $SiO_xN_y$, for example, $Si_2ON_2$), of hafnium oxide ($HfO_2$), or of aluminum oxide ($Al_2O_3$).

Optoelectronic device 30 operates as follows. When the voltage applied between conductive pads 22 and 24 is sufficient, photons are emitted by active area 18 and propagate in central portion 34 of semiconductor layer 32. Opaque reflective portion 44 prevents any radiation from coming out of central part 40 of front surface 38 so that optoelectronic device 30 has no direct radiation mode. The radiation thus propagates from central portion 34 to peripheral portion 36 of semiconductor layer 32. A plurality of guided modes may be present in central portion 34, as schematically shown by a plurality of radiuses 52 in FIG. 2. However, a single guided mode is possible in peripheral portion 36. Diffraction grating 46 is defined to ease the extraction of the radiation which propagates along the single guided mode in peripheral portion 36. The radiation thus comes out of peripheral part 42 of front surface 38 via diffraction grating 46 as schematically shown by wavefronts 54 in FIG. 2. Given that there is a single guided mode which propagates in peripheral portion 36, the radiation comes out of peripheral part 42 of front surface 38 substantially along the same direction, which depends on diffraction grating 46.

The extraction efficiency of optoelectronic device 30 is thus increased. The only losses are losses by absorption of the electromagnetic radiation in the different materials forming optoelectronic device 30. Further, all the radiation which comes out of peripheral part 42 is directed along the same direction. The directivity of optoelectronic device 30 is advantageously increased.

According to an embodiment, diffraction grating 46 enables to extract the electromagnetic radiation along a direction substantially parallel to direction Z to within 10°, that is, substantially orthogonally to central part 40.

Figure 3:
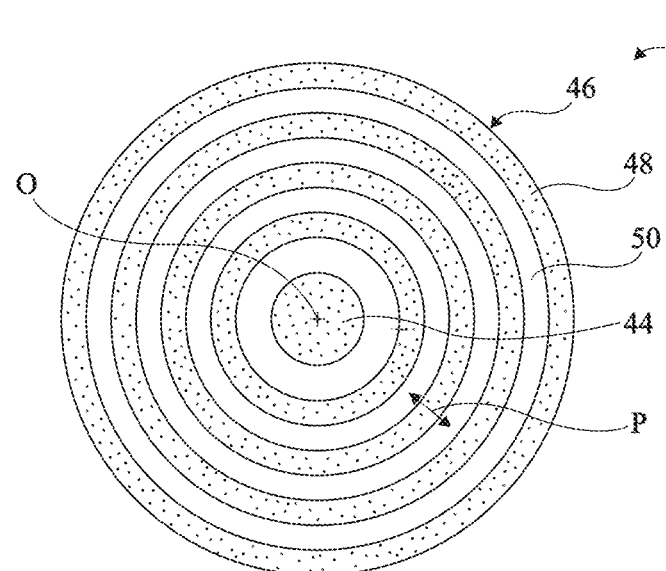
FIG. 3 is a partial simplified top view of an embodiment of a diffraction grating of the optoelectronic device of FIG. 2.

FIG. 3 is a top view of optoelectronic device 30 and illustrates an embodiment of diffraction grating 46 where raised portions 48 correspond to concentric circular rings and where recessed portions 50 correspond to concentric circular grooves. Diffraction grating 46 is periodic when the distance, measured radially, between two adjacent rings 48 is constant.

Call $n_{eff}$ the effective index of the guided mode in peripheral portion 36, the period P of diffraction grating 46 required to extract the guided mode along direction Z is given by the following relation (II):

$$P = \frac{\lambda}{n_{eff}} \qquad (II)$$

where $\lambda$ is the wavelength of the radiation emitted by active area 18. The thickness of raised portions 48 is in the range from one tenth to half of the thickness of peripheral portion 36, for example, substantially equal to one quarter of the thickness of peripheral portion 36. Filling factor f of diffraction grating 46, which corresponds to the ratio of the radial dimension of ring 48 to period P, is in the range from 25% to 75%, for example, in the order of 50%.

Simulations have been performed by finite-difference time-domain calculation. For the simulations, semiconductor layers 14 and 16 or 32 were made of GaN and active area 18 comprised multiple quantum wells comprising an alternation of GaN layers and of AlGaN layers.

A first simulation has been carried out with the structure of optoelectronic device 10 shown in FIG. 1. Semiconductor layer 16 had a 0.1-μm thickness. A second simulation has been carried out with the structure of optoelectronic device 30 shown in FIGS. 2 and 3. Peripheral portion 36 of semiconductor layer 32 had a 1.4-μm thickness. For the second simulation, opaque portion 44 was not present. A third simulation has been performed with the same structure as for the second simulation, with the difference that opaque portion 44 was present.

Figure 4:
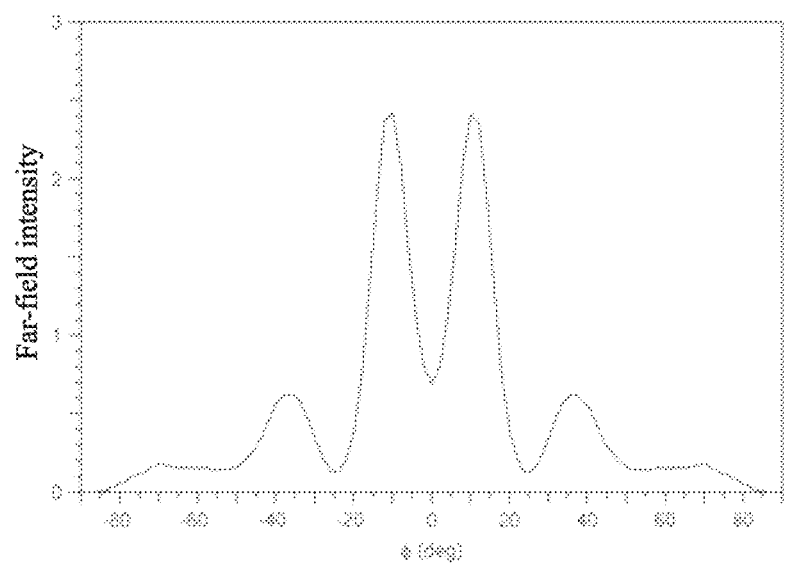
FIGS. 4 to 6 show far-field angular emission patterns obtained by simulation for three optoelectronic devices having different structures.
Figure 5:
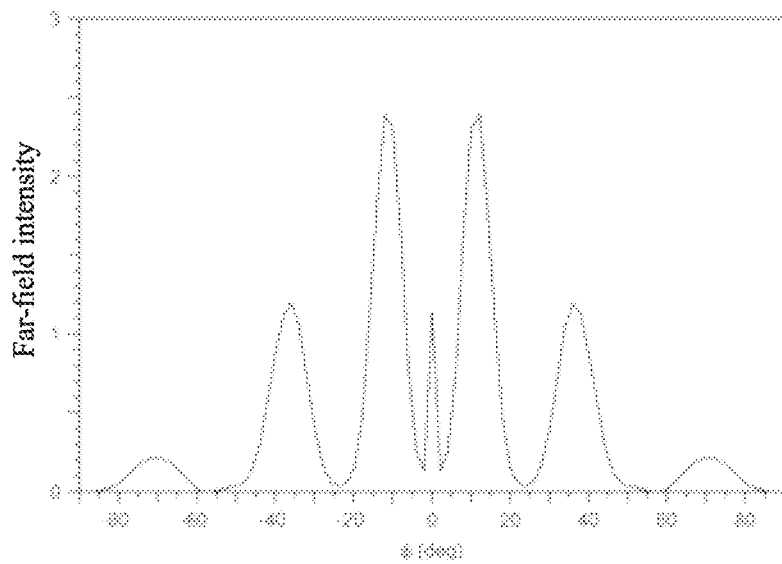
Figure 6:
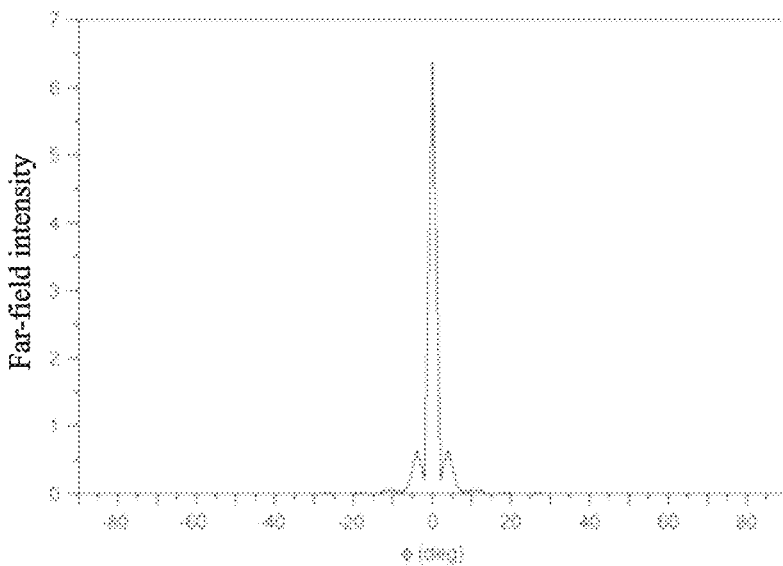

FIGS. 4, 5, and 6 show far-field angular emission patterns obtained with the first, second, and third simulations, respectively. As appears in FIG. 6, the emission obtained for the third simulation is highly directional, as compared with the emissions of the optoelectronic devices of the first and second simulations, with an emission which is more or less 1.5° away from direction Z and with a power in this cone at least three times greater than that of the optoelectronic device of the first simulation.

FIG. 7 is a partial simplified cross-section view of another embodiment of an optoelectronic device 60. Optoelectronic device 60 comprises all the elements of optoelectronic device 30 shown in FIG. 2 and further comprises a layer 62 covering at least peripheral part 42 of front surface 38. Layer 62 is at least partially transparent to the wavelength of the electromagnetic radiation emitted by active area 18 and is made of a material having a refractive index higher than the refractive index of air at the wavelength of the electromagnetic radiation emitted by active area 18, and smaller than that of the material forming semiconductor layer 32. Layer 62 may be insulating or conductive. When layer 62 is conductive, it is advantageously in electric contact with layer 44 and forms a common cathode having a small resistance. In this case, electrode 24 may be suppressed. The thickness of layer 62 may be in the range from 10 nm to 2,000 nm. When it is made of an insulating material, layer 62 is for example made of silicon nitride, $SiO_2$, $HfO_2$ or of $Al_2O_3$. When it is made of a conductive material, layer 62 is for example made of at least one conductive transparent oxide, particularly of aluminum-doped zinc oxide (AZO), of indium tin oxide (or ITO), or of indium gallium zinc oxide (IGZO).

The presence of layer 62 enables to increase the thickness of peripheral portion 36 of semiconductor layer 32 while ascertaining that peripheral portion 36 always behaves as a single-mode waveguide. Indeed, the maximum thickness up to which peripheral portion 36 of semiconductor layer 32 behaves as a single-mode waveguide increases as the refractive index difference between peripheral portion 36 and the contiguous layer decreases. As an example, layer 62 may be made of silicon nitride which has a refractive index equal to 2 at a wavelength from 400 nm to 800 nm, of indium-tin oxide (or ITO) which has a refractive index equal to 2.1 at the 405-nm wavelength, of zinc oxide, doped or not with aluminum or gallium, or of graphene. The thickness of layer 62 may be in the range from 10 nm to 2,000 nm.

Diffraction grating 46 of the embodiment of the light-emitting diode shown in FIGS. 2 and 3 is capable of extracting the electromagnetic radiation emitted by active area 18 substantially along direction Z. However, for certain applications, it may be desirable for the electromagnetic radiation emitted by active area 18 to be extracted from the optoelectronic device along a direction which is inclined with respect to direction Z. An example of application relates to screens displaying three-dimensional images. Indeed, an array of pixels which emit at different angles enables to display different images in different directions to obtain a three-dimensional visual impression.

Figure 8:
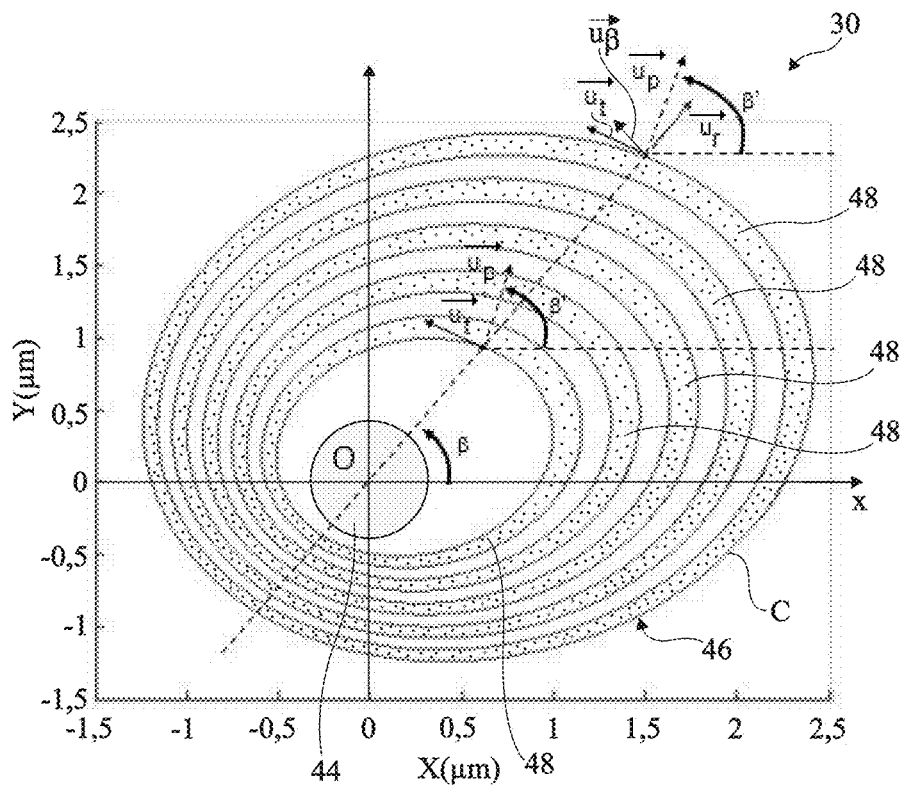
FIG. 8 schematically shows an embodiment of a diffraction grating of the optoelectronic device of FIG. 2.

FIG. 8 is a partial simplified top view of optoelectronic device 30 and illustrates another embodiment of diffraction grating 46 enabling to extract an electromagnetic radiation along a direction which is inclined with respect to a direction perpendicular to the front surface of optoelectronic device 30. In FIG. 8, an orthonormal reference frame (Oxyz) has been shown. Center O corresponds to the center of opaque portion 44 which, as an example, is shown as having a circular shape. Direction (Oz) corresponds to previously-described direction Z and plane (xOy) corresponds to a plane parallel to front surface 38 of optoelectronic device 30. In this reference frame, each point of front surface 38 may be located by polar coordinates (r,β) or Cartesian coordinates (X,Y). Note $\vec{u}_r$ and $\vec{u}_S$ the unit vectors in polar coordinates of the point having coordinates (r,β) In FIG. 8, the lateral surfaces of five rings 48 of the diffraction grating have been schematically shown by curves C.

Figure 9:
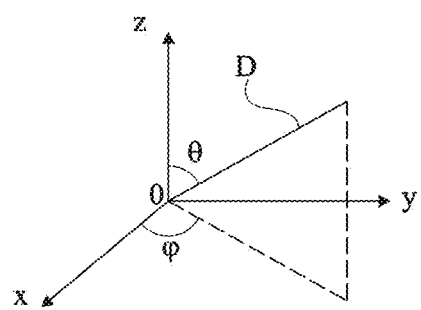
FIG. 9 illustrates the angles used to define the direction of emission of a radiation by the optoelectronic device comprising a light-emitting diode.

In the present embodiment, light is desired to be extracted from plane (xOy) along a direction D given by a polar angle θ, relative to direction Z, and an azimuthal angle φ, in plane (xOy) as illustrated in FIG. 9. The electromagnetic radiation propagates substantially radially in peripheral portion 36 before its extraction by diffraction grating 46. The wave vector $\vec{k}_{emission}$ associated with the radiation in peripheral portion 36 thus only has a radial component, and thus only vectorially depends on angle μ. Wave vector $\vec{k}_{emission}$ is given by the following relation (III):

$$\vec{k}_{emission}(\beta) = \frac{2\pi}{\lambda} n_{eff} \vec{u}_r \quad (III)$$

Whatever the considered angle β, diffraction grating 46 should be able to extract the electromagnetic radiation out of plane (xOy) along direction D defined by angles θ and φ.

According to the present embodiment, diffraction grating 46 comprises rings surrounding center O, which do not have a circular shape. For any angle β, the rings are periodically arranged along line (O, $\vec{u}_r$) with a period P which only depends on angle β. For any angle β, each ring is defined by vectors $\vec{u}_v$ and $\vec{u}_r$ where $\vec{u}_r$ is a unit vector in plane (xOy) which is tangent to curve C of the ring and $\vec{u}_v$ is a unit vector in plane (xOy) which is perpendicular to curve C of the edge of the ring. Vectors $\vec{u}_v$ and $\vec{u}_r$ only depend on angle β. Call β' the angle between unit vector and axis (Ox). Angle β defines the direction or the orientation of diffraction grating 46.

Unit vector $\vec{u}_t$ is given by the following relation (IV):

$$\vec{u}_t = \begin{vmatrix} -\sin\beta' \\ \cos\beta' \end{vmatrix} \quad (IV)$$

Whatever angle β, wave vector $\vec{k}_{attraction}$ of the electromagnetic radiation extracted by diffraction grating 46 is given by the following relation (V):

$$\vec{k}_{emission}(\beta) - \frac{2\pi}{P} \vec{u}_p(\beta) = \vec{k}_{extraction} \quad (V)$$

Relation (V) can be rewritten as:

$$\frac{2\pi}{\lambda} n_{eff} \begin{pmatrix} \cos\beta \\ \sin\beta \end{pmatrix} - \frac{2\pi}{P} \begin{pmatrix} \cos\beta' \\ \sin\beta' \end{pmatrix} = \frac{2\pi}{\lambda} \begin{pmatrix} \sin\theta\cos\varphi \\ \sin\theta\sin\varphi \end{pmatrix}$$

The following relation (VI) is obtained after simplification:

$$\frac{1}{P} \begin{pmatrix} \cos\beta' \\ \sin\beta' \end{pmatrix} = \frac{1}{\lambda} \left[ n_{eff} \begin{pmatrix} \cos\beta \\ \sin\beta \end{pmatrix} - \begin{pmatrix} \sin\theta\cos\varphi \\ \sin\theta\sin\varphi \end{pmatrix} \right] \quad (VI)$$

Vector relation (VI) corresponds to two scalar relations. By dividing these two scalar equations, the expression of angle β is obtained according to the following relation (VII):

$$\beta' = \tan^{-1}\left[ \frac{n_{eff}\sin\beta - \sin\theta\sin\varphi}{n_{eff}\cos\beta - \sin\theta\cos\varphi} \right] \quad (VII)$$

By summing the square of these two scalar equations, the expression of period P is obtained according to the following relation (VIII):

$$P = \frac{\lambda}{\sqrt{n_{eff}^2 + \sin\theta^2 - 2n_{eff}\sin\theta\cos(\varphi - \beta)}} \quad (VIII)$$

Specific configurations can be deduced from relation (VI). As an example, the orientation of diffraction grating 46 is horizontal, which corresponds to β equal to 0, for:

$$\beta = \sin^{-1}\left(\frac{\sin\theta\sin\varphi}{n_{eff}}\right) \Leftrightarrow \beta' = 0 \quad (VIII)$$

According to another example, the orientation of diffraction grating 46 is vertical, which corresponds to β equal to ±π/2, for:

$$\beta = \cos^{-1}\left(\frac{\sin\theta\cos\varphi}{n_{eff}}\right) \Leftrightarrow \beta' = \pm\frac{\pi}{2} \quad (IX)$$

According to another example, the orientation and the radial direction are equal, which corresponds to β equal to β', for:

$$\beta = \beta' = \varphi \pm \pi \quad (X)$$

According to an embodiment, in a plane perpendicular to direction Z, the lateral surfaces of rings 48 substantially correspond to ellipses. According to an embodiment, the ellipses have a common focus which corresponds to center O and have the same major axis.

Figure 10:
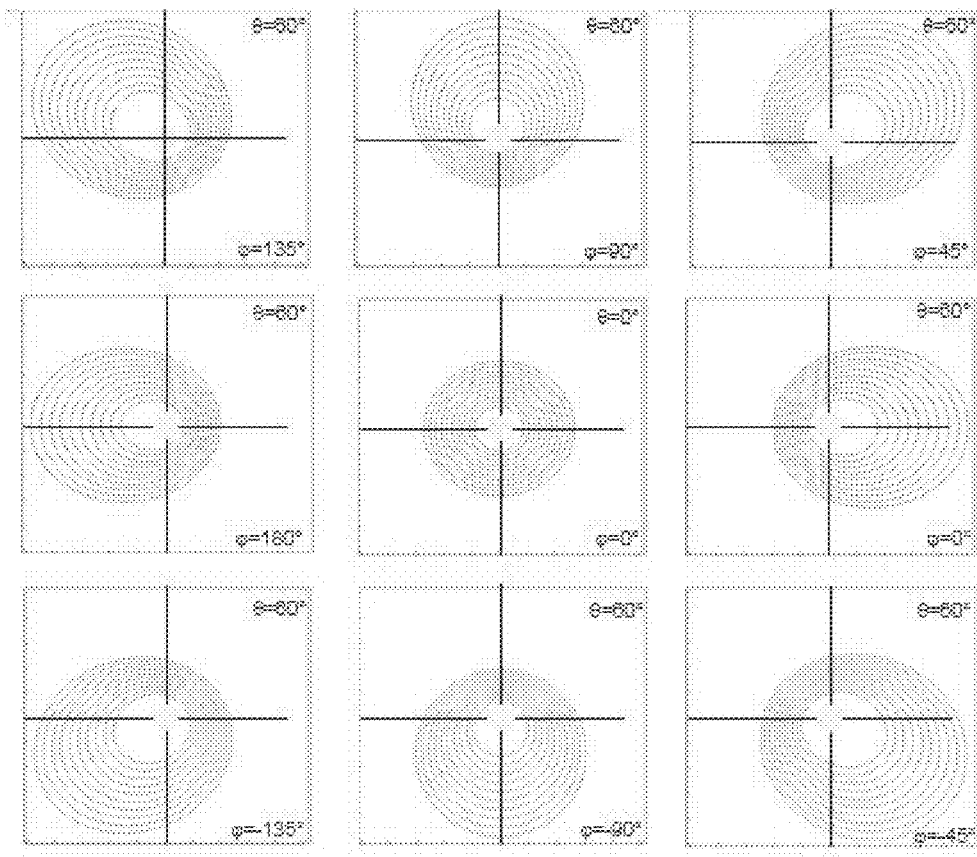
FIG. 10 schematically shows other embodiments of diffraction gratings of the optoelectronic device of FIG. 2.

FIG. 10 is a view similar to FIG. 8 illustrating nine diffraction grating configurations. For each grating, the angles θ and φ of direction D of emission of the electromagnetic radiation obtained with the diffraction grating have been indicated.

Figure 11:
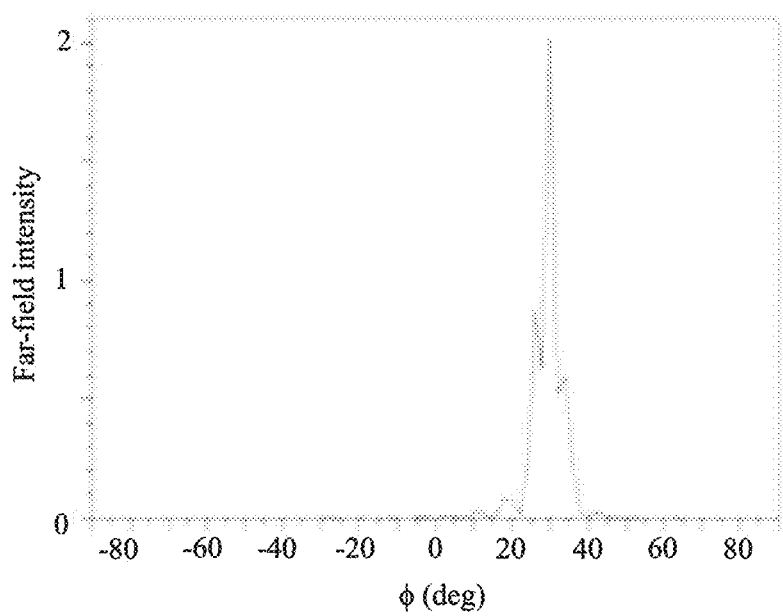
FIG. 11 shows a far-field angular emission pattern obtained by simulation for a light-emitting diode having a diffraction grating of the type shown in FIG. 8.

FIG. 11 shows a far-field angular emission pattern obtained by simulation for an optoelectronic device 30 having the same characteristics as for the obtaining of the emission pattern shown in FIG. 6 and with a diffraction grating of the type shown in FIG. 8 for which direction D of emission of the electromagnetic radiation is defined by angles θ equal to 30° and φ equal to 0°. For the diffraction grating enabling to obtain the angular emission pattern of FIG. 6, period P is 205 nm. For the diffraction grating enabling to obtain the angular emission pattern of FIG. 11, period P for β equal to 0° is equal to 270 nm and period P for β equal to 180° is equal to 162 nm.

FIGS. 12A to 12J are partial simplified cross-section views of structures obtained at successive steps of an embodiment of a method of simultaneously manufacturing a plurality of optoelectronic devices 30 as shown in FIG. 2, each optoelectronic device 30 for example corresponding to a display pixel of a display device.

Figure 12A:
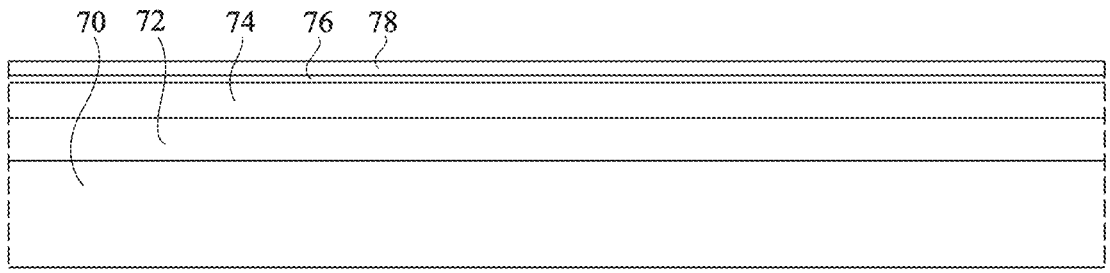
FIGS. 12A to 12J are partial simplified cross-section views of the structures obtained at successive steps of another embodiment of a method of manufacturing an optoelectronic device of the type shown in FIG. 2.

The method comprises the successive steps of:

(1) Forming, for example by epitaxy, on a substrate 70, a stack of semiconductor layers successively comprising an intermediate layer 72, a doped layer 74 of a first conductivity type, for example, type N, an active layer 76 and a doped layer 78 of a second conductivity type, for example, type P, opposite to the first conductivity type (FIG. 12A). Substrate 70 may correspond to a monoblock structure or correspond to a layer covering a support made of another material. Substrate 70 may be a semiconductor substrate, for example, a substrate made of silicon, of germanium, of silicon carbide, of a III-V compound such as GaN or GaAs, or a ZnO substrate. Substrate 70 may correspond to a multilayer structure of silicon-on-insulator type, also called SOI. Substrate 70 may be made of an insulating material, for example, of sapphire.

Figure 12B:
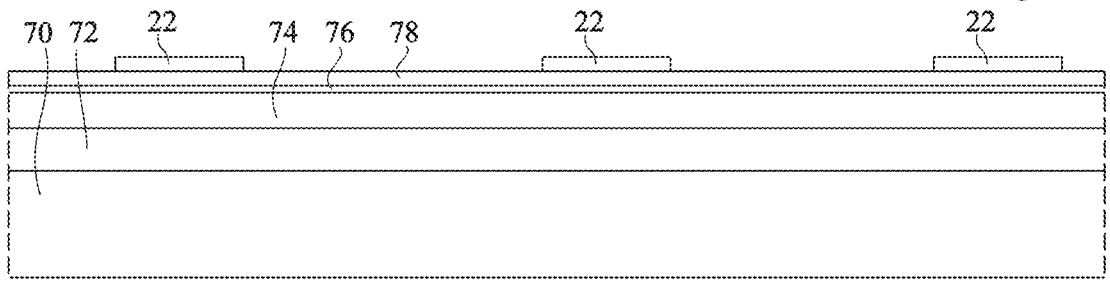

(2) Depositing a metal layer on layer 78 and etching the metal layer to delimit conductive pad 22 for each optoelectronic device (FIG. 12B).

Figure 12C:
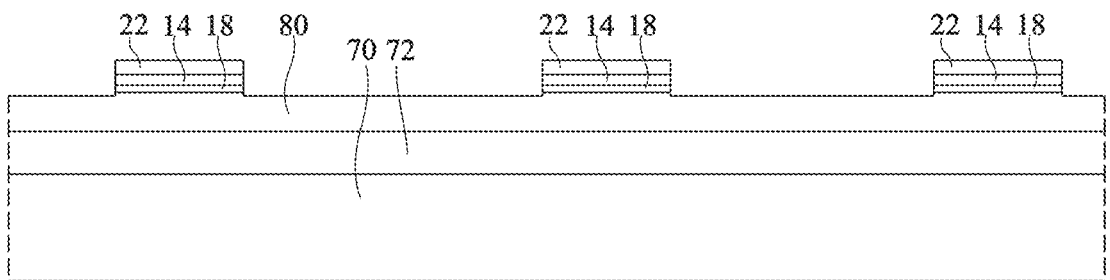

(3) Etching layer 78, active layer 76, and a part of the thickness of layer 74, the etching stopping in layer 74 to delimit, for each optoelectronic device, semiconductor layer 14, active area 18, and a semiconductor portion 80 (FIG. 12C).

Figure 12D:
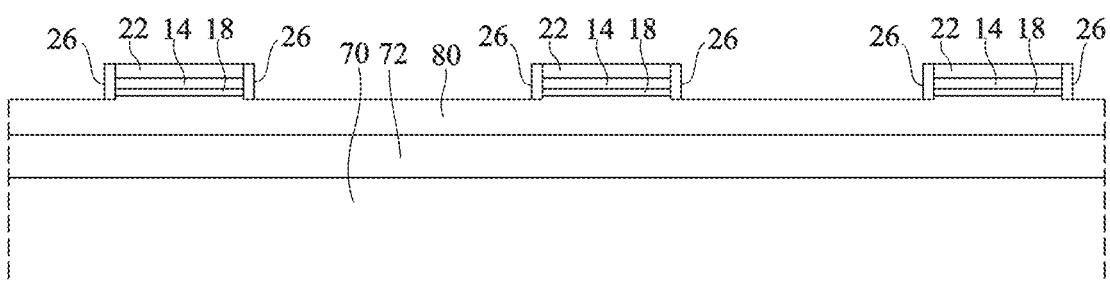

(4) Depositing an electrically-insulating layer over the entire structure and anisotropically etching the electrically-insulating layer to delimit insulating portion 26 for each optoelectronic device (FIG. 12D).

Figure 12E:
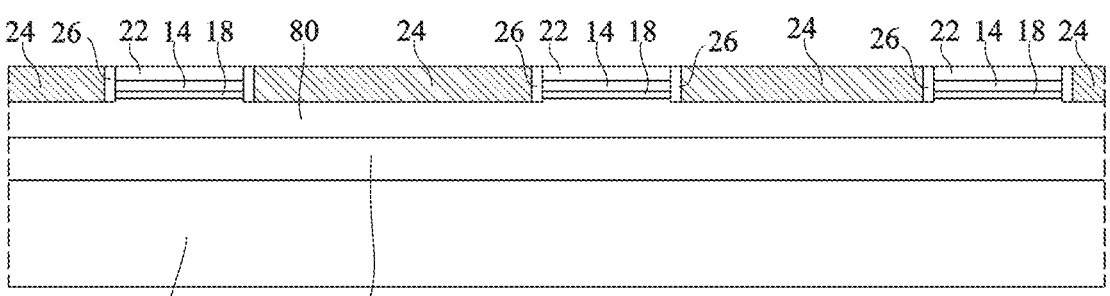

(5) Depositing a metal layer over the entire structure and etching the metal layer, for example, by chem.-mech. planarization to delimit conductive pad 24 for each optoelectronic device (FIG. 12E). An optoelectronic device 82 is thus obtained.

Figure 12F:
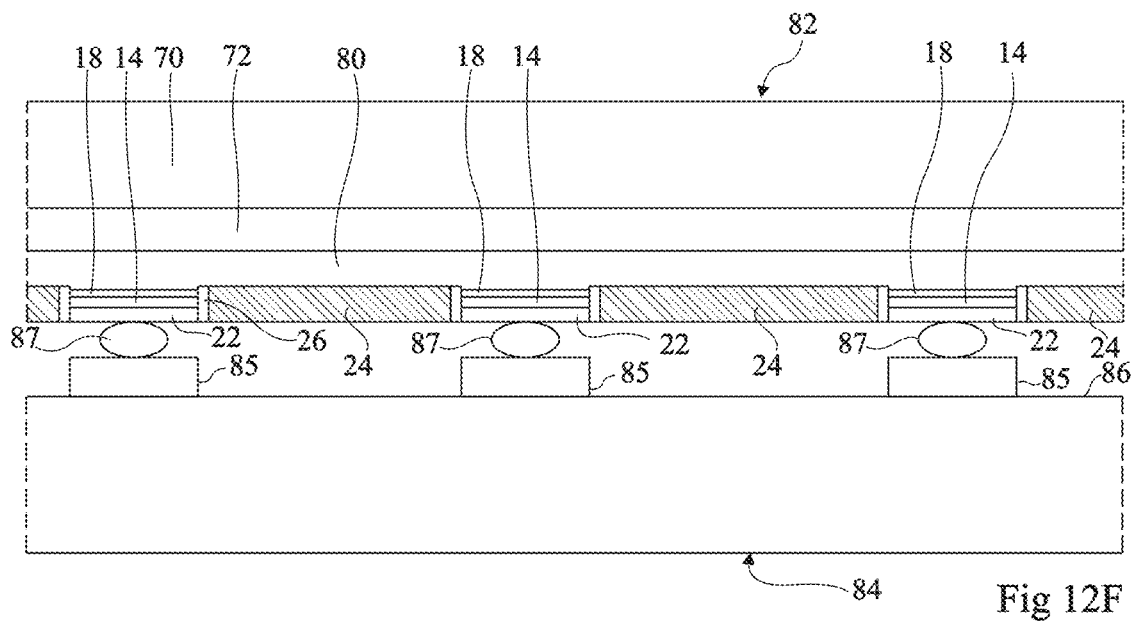

(6) Affixing optoelectronic device 82 to an electronic circuit 84 (FIG. 12F). Electronic circuit 84 comprises electronic components, not shown. In FIG. 12F, only conductive pads 85 have been shown on a surface 86 of electronic circuit 84. Conductive pads 85 are electrically connected to conductive pads 22 and/or 24. According to the spacing between conductive pads 85, the connection between optoelectronic device 82 and electronic circuit 84 may be formed via conductive balls 87 or microtubes.

Figure 12G:
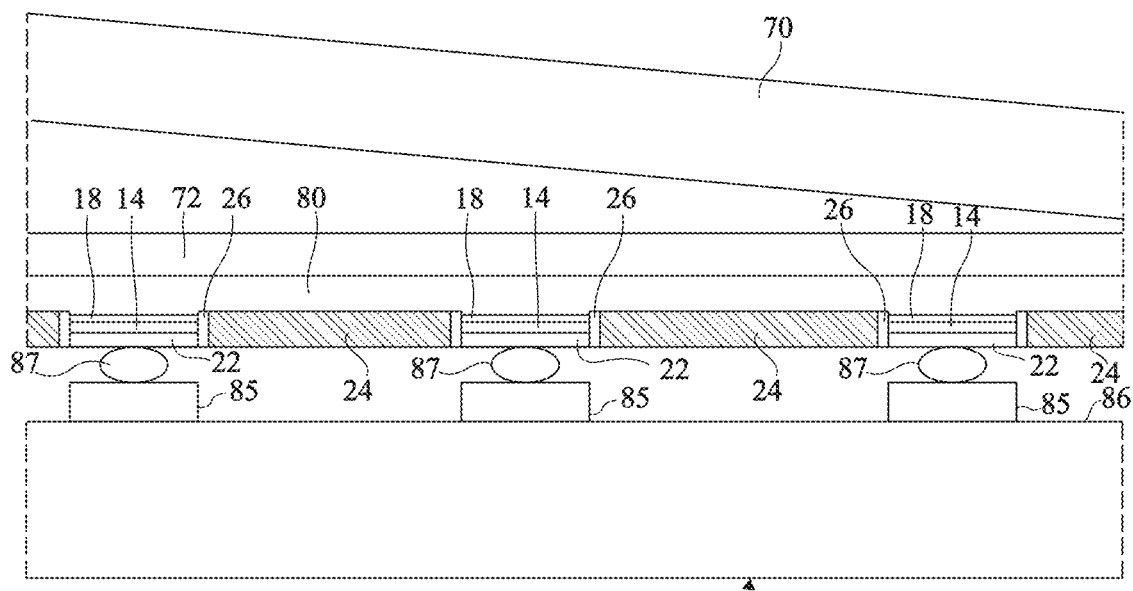

(7) Removing substrate 70, for example, by a lift off method (FIG. 12G).

Figure 12H:
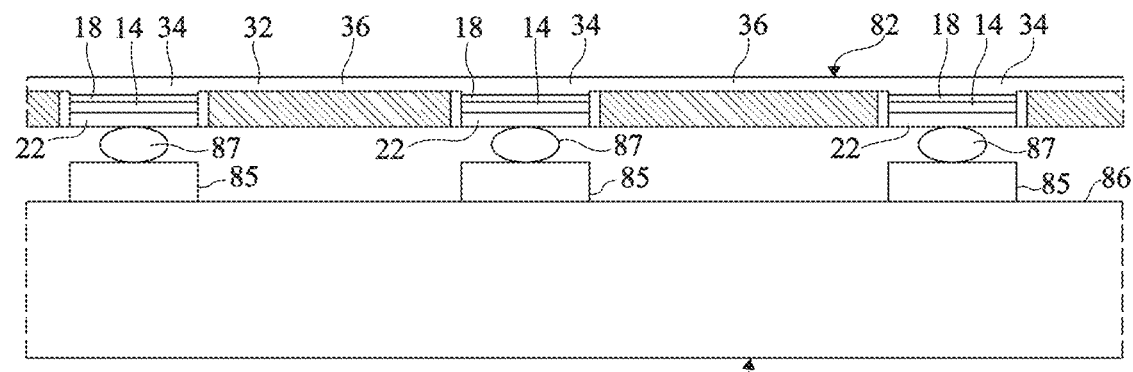

(8) Etching the entire intermediate layer 72 and partially etching semiconductor portion 80, only across a part of the thickness of semiconductor portion 80, to delimit semiconductor layer 32 for each optoelectronic device (FIG. 12H).

Figure 12I:
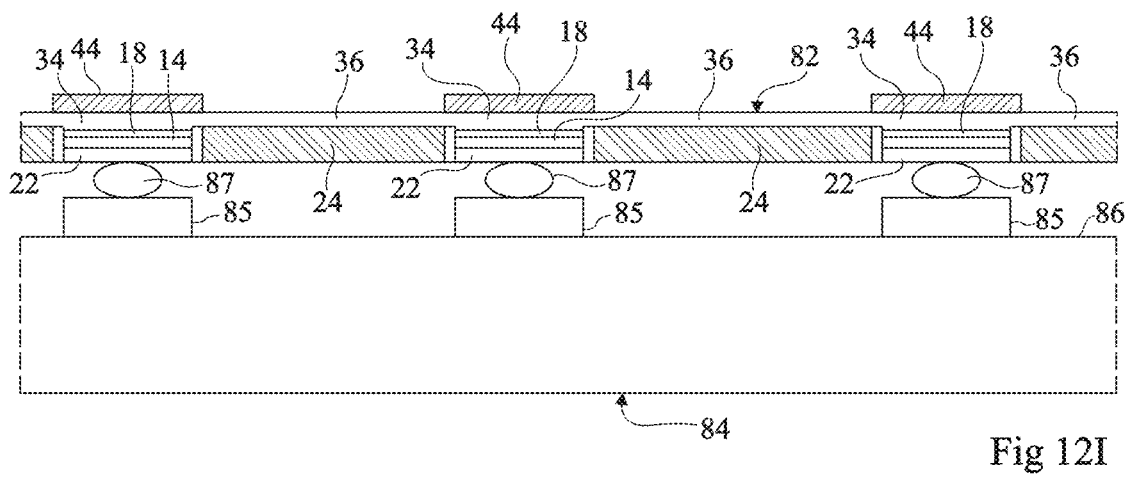

(9) Depositing a metal layer on semiconductor layer 32 and etching of the metal layer to delimit opaque portion 44 for each optoelectronic device (FIG. 12I).

Figure 12J:
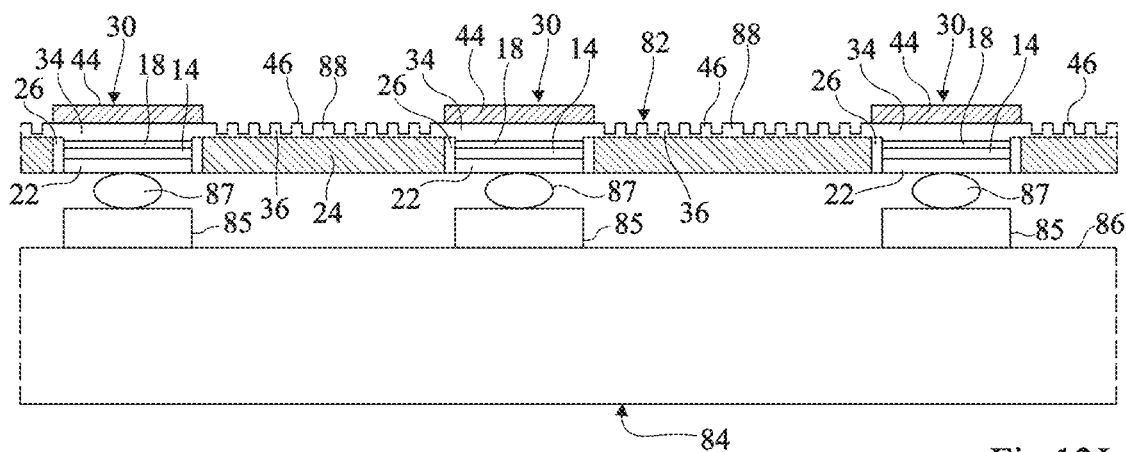

(10) Forming diffraction grating 46 for each optoelectronic device by etching patterns in peripheral portion 36 of semiconductor layer 32 (FIG. 12J). An optoelectronic device 82 comprising a plurality of optoelectronic devices 30 is obtained. A non-structured area 88 may be left between two adjacent optoelectronic devices 30.

The method may further comprise a step of depositing a transparent layer covering at least portions 36 to obtain the structure shown in FIG. 7.

Figure 13:
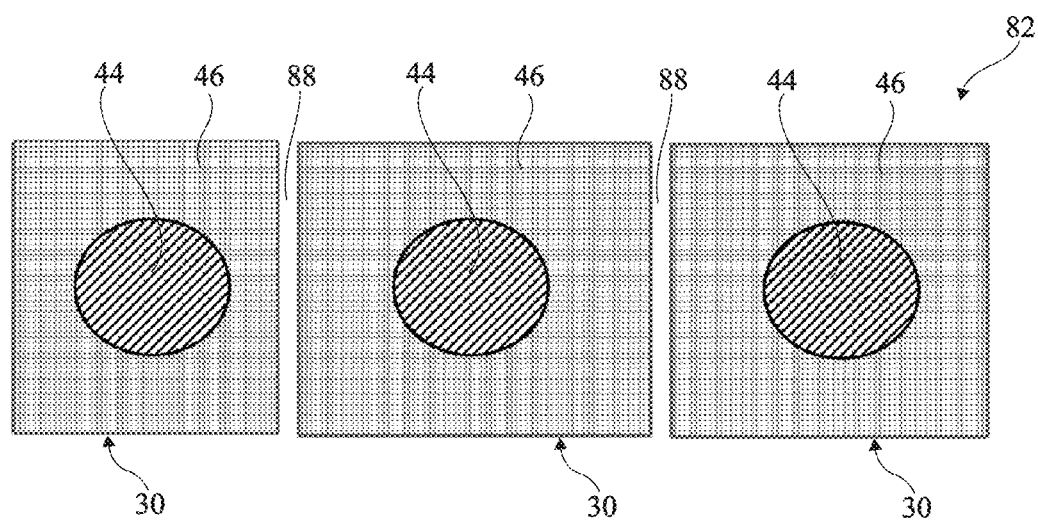
FIG. 13 is a partial simplified top view of the structure shown in FIG. 12J for a different embodiment of the optoelectronic device.

FIG. 13 shows a very simplified top view of an embodiment of optoelectronic device 82 after the step shown in FIG. 12J. For each optoelectronic device 30, opaque portion 44 is central and is surrounded with diffraction grating 46.

FIGS. 14A to 14H are partial simplified cross-section views of the structures obtained at successive steps of another embodiment of a method of simultaneously manufacturing a plurality of copies of optoelectronic device 30 shown in FIG. 2, each optoelectronic device 30 for example corresponding to a display pixel of a display device.

Figure 14A:
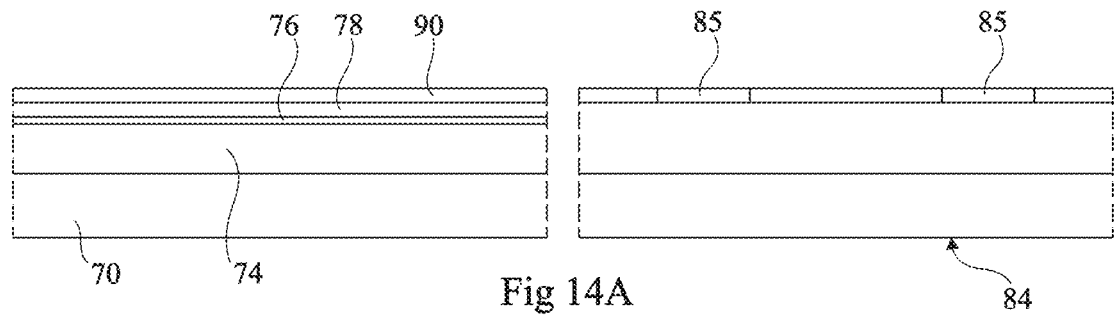
FIGS. 14A to 14H are partial simplified cross-section views of the structures obtained at successive steps of another embodiment of a method of manufacturing an optoelectronic device of the type shown in FIG. 2.

The method comprises the successive steps of:

(1') Manufacturing the same structure as that shown in FIG. 12A, with the difference that semiconductor layer 72 is not shown and that a metal layer 90 covers layer 78, and separately manufacturing electronic circuit 84 (FIG. 14A).

Figure 14B:
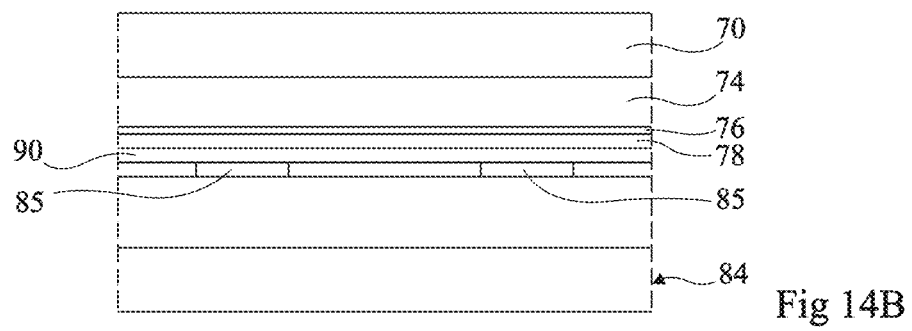

(2') Affixing optoelectronic device 82 to electronic circuit 84, for example, by gluing (FIG. 14B). Conductive pads 85 are electrically connected to metal layer 90.

Figure 14C:
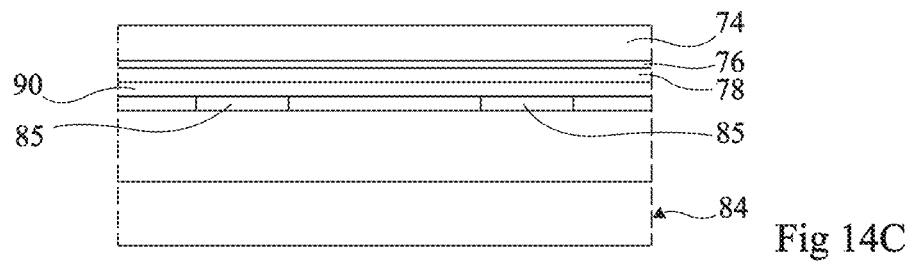

(3') Removing substrate 70 (FIG. 14C).

Figure 14D:
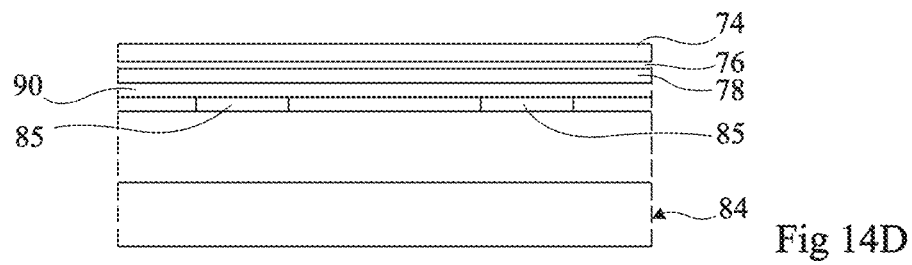

(4') Etching semiconductor layer 74 across part of its thickness (FIG. 14D).

Figure 14E:
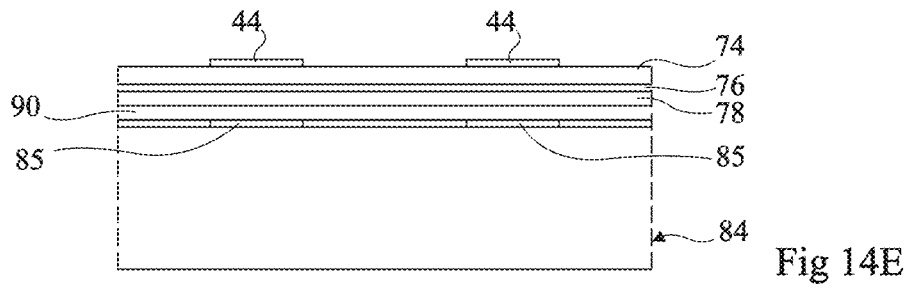

(5') Depositing a metal layer on thinned semiconductor layer 78 and etching of the metal layer to delimit the opaque portion 44 of each optoelectronic device (FIG. 14E).

Figure 14F:
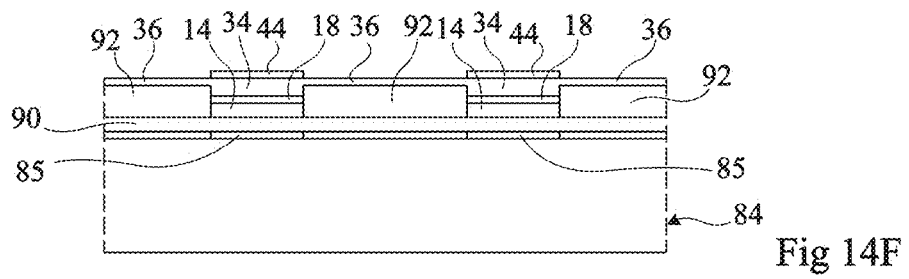

(6') Implanting, by using opaque portions 44 as a mask, materials into semiconductor layer 74 across a part of the thickness of semiconductor layer 74, into active layer 76 across the entire thickness of the active layer, and into semiconductor layer 78 across the entire thickness of semiconductor layer 78 to degrade the electronic properties in these layers and to form, for each optoelectronic device, a region 92 which delimits semiconductor layer 14, active area 18, and conductive layer 32 (FIG. 14F). The implantation parameters are selected to leave intact a surface layer of semiconductor layer 74 which corresponds to the previously-described portion 36. The species to be implanted are selected to electrically degrade the implanted areas, in the sense that they become electrically insulating.

(7') Separating the light-emitting diodes (FIG. 14G), for example, by successively etching the semiconductor layers and metal layer 90.

Figure 14G:
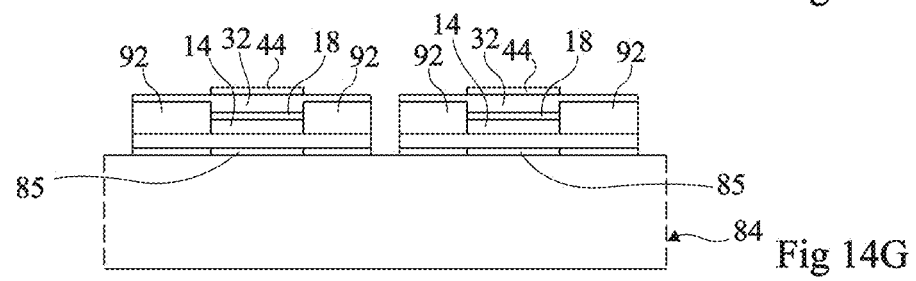
Figure 14H:
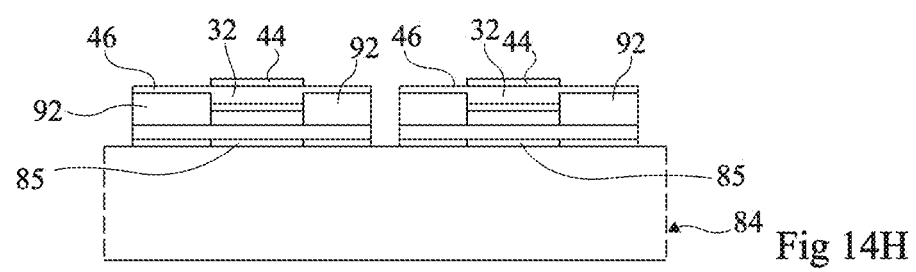

(8') Forming diffraction grating 46 of each optoelectronic device 30 by partially etching peripheral portion 36 of semiconductor layer 32 (FIG. 14G).

Electrodes 44 are connected together by elements, not shown (for example, by a transparent conductive plane or by an insulating and then conductive additional level) to form a common cathode. The light-emitting diodes are individually addressed on the anode side by the active array (pads 85) and have a common cathode contact.

FIGS. 15A to 15D illustrate successive steps of an embodiment of a method of manufacturing a diffraction grating 46 such as that shown in FIG. 8 for which the direction of the transmission of the electromagnetic radiation by diffraction grating 46 is not orthogonal to the front surface of the optoelectronic device.

This method takes advantage of the previously-described relation (X). Indeed, this relation means that when angle β is equal to angle φ, angle β' is also equal to angle φ. For this specific direction, the rings of the diffraction grating are oriented along this same direction.

Figure 15A:
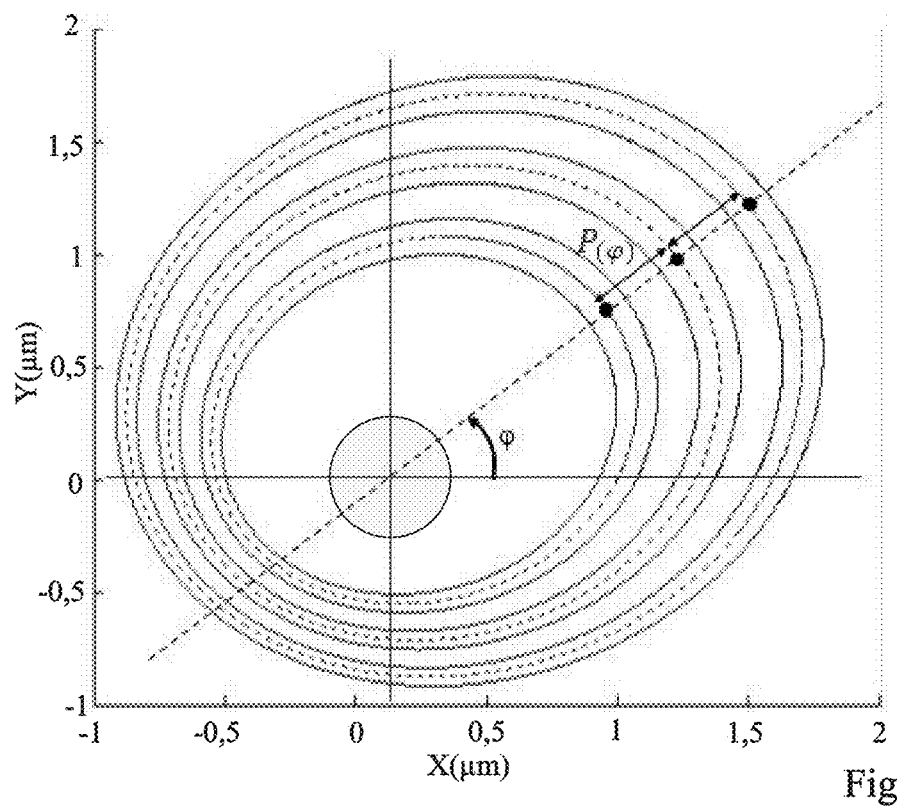
FIGS. 15A to 15D illustrate the steps of an embodiment of a method of designing a diffraction grating.
Figure 15B:
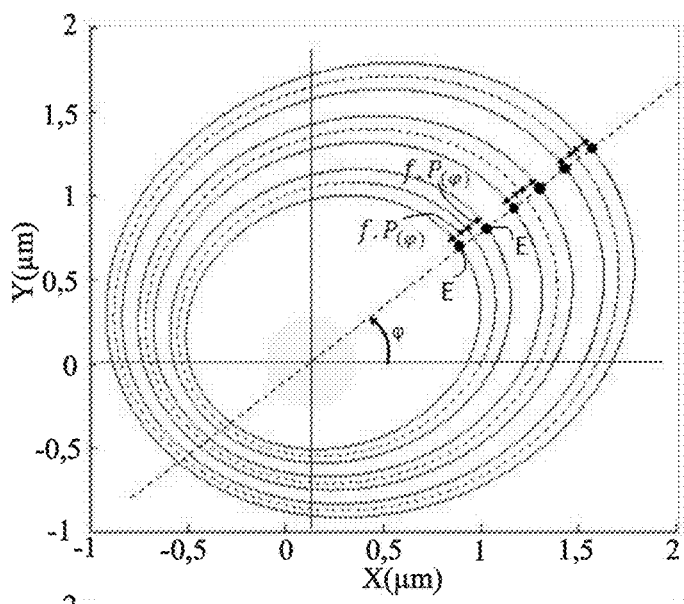
Figure 15C:
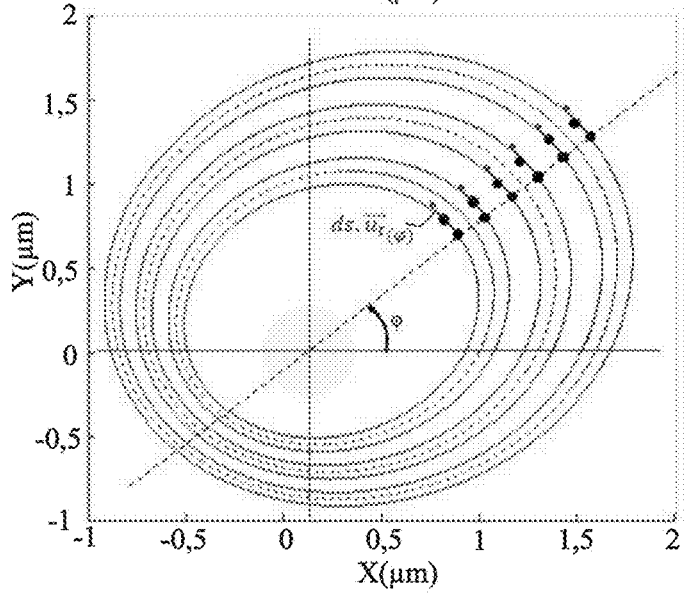
Figure 15D:
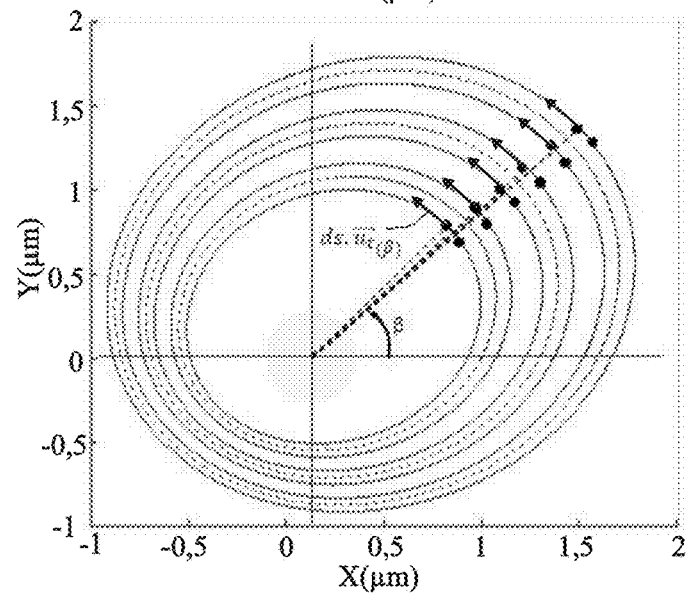

The method comprises the successive steps of:
- determining the mean line of each ring in direction φ, taking into account the fact that the rings are perfectly equidistant along direction φ by a distance P(φ) given by relation (VIII) (FIG. 15A);
- determining along direction φ the lateral ends E of each ring, according to the selected filling factor f which may be equal to 50% (FIG. 15B); and
- determining step by step rings by revolution, by creating new points generated by the tangent given by vector $\vec{u}_t$ at each point given by β' obtained by relation (VII) (FIGS. 15C and 15D).

Figure 16:
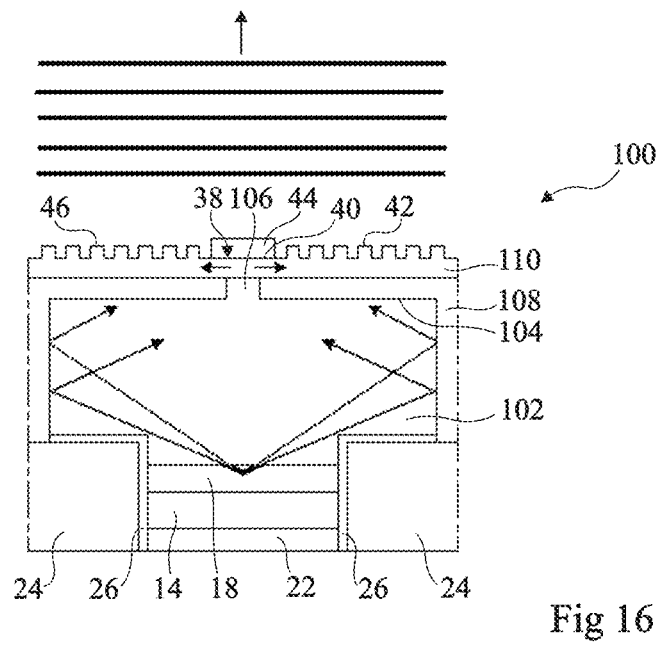
FIGS. 16 to 17 are partial simplified cross-section views of other embodiments of an optoelectronic device comprising a light-emitting diode.

FIG. 16 is a partial simplified cross-section view of another embodiment of an optoelectronic device 100 comprising a light-emitting diode. Optoelectronic device 100 comprises all the elements of optoelectronic device 30 shown in FIG. 2, with the difference that semiconductor layer 32 is replaced with a structure comprising, from bottom to top in FIG. 16:
- a semiconductor layer 102 in contact with active area 18 and comprising an upper surface 104;
- a pad 106 of the same material as semiconductor layer 102 and protruding from upper surface 104;
- an intermediate layer 108 surrounding semiconductor layer 102, and in particular covering the entire upper surface 104, surrounding pad 106 without however covering pad 106; and
- a layer 110 covering intermediate layer 108 and in contact with pad 106.

Semiconductor layer 102 may be made of the same material as semiconductor layer 32. Layer 110 may be made of the same material as semiconductor layer 102 or of a different material. According to an embodiment, layer 110 is made of titanium oxide ($TiO_2$), of silicon nitride (SiN), or of tantalum oxide ($Ta_2O_5$). Layer 108 may be made of the same material as conductive pad 24.

The thickness of layer 110 is determined so that the radiation may propagate in layer 110 along a single propagation mode. Layer 110 then corresponds to a single-mode waveguide. Similarly, the dimensions of pad 106 are determined so that the radiation can propagate in the pad along a single propagation mode. Pad 106 then corresponds to a single-mode waveguide.

Front surface 38 is delimited by layer 110. As previously described, front surface 38 divides into central part 40, covered with substantially opaque portion 44 reflective for the radiation emitted by active area 18, and peripheral part 42 where diffraction grating 46 is formed.

Unlike optoelectronic device 30 shown in FIG. 2, in the embodiment shown in FIG. 16, opaque portion 44, also called opaque cover, does not cover the entire active area 18 but may only cover pad 106.

An embodiment of a method of manufacturing optoelectronic device 110 comprises the same steps as those previously described in relation with FIGS. 12A to 12G, with the difference that layer 32 is replaced with layer 102. The step previously described in relation with FIG. 12H is replaced with the steps of:
- possibly thinning layer 102;
- laterally delimiting layer 102 for each pixel;
- etching layer 102 at the surface to form pad 106 for each pixel;
- forming layer 108; and
- depositing layer 110.

According to an embodiment, the method carries on with the steps previously described in relation with FIGS. 12I and 12J, with the difference that the steps are carried out on layer 110 instead of layer 32.

Figure 17:
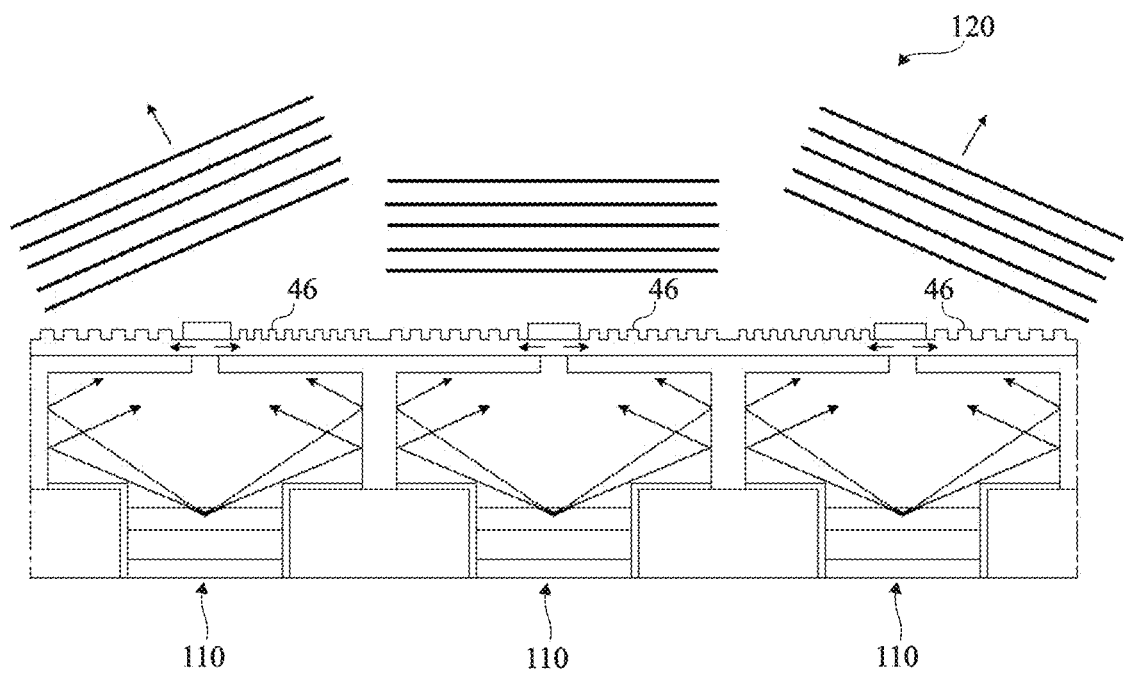

FIG. 17 is a partial simplified cross-section view of another embodiment of an optoelectronic device 120 comprising a light-emitting diode. Optoelectronic device 120 comprises a plurality of optoelectronic devices 110 of the type shown in FIG. 16, which each play the role of a pixel, the diffraction gratings 46 of optoelectronic devices 110 being adapted for pixels emitting in different directions.

Specific embodiments have been described. Various alterations, modifications, and improvements will occur to those skilled in the art. Although in the previously-described embodiments, the diffraction gratings comprise rings, the diffraction gratings may have a different structure.

The invention claimed is:

1. An optoelectronic device comprising an active area capable of supplying an electromagnetic radiation and sandwiched between first and second semiconductor layers, the optoelectronic device comprising a third semiconductor layer, integrated to the first semiconductor layer or in contact with the first semiconductor layer, the third semiconductor layer delimiting a surface and comprising a first portion at least partially covering the active area and delimiting a first part of the surface and being continued by a second portion delimiting a second part of the surface, the second portion forming a single-mode waveguide, the optoelectronic device comprising an opaque portion which is reflective for electromagnetic radiation, covering the first part of the surface, and comprising a diffraction grating in the second part of the surface capable of extracting the electromagnetic radiation from the second portion,
   wherein the thickness of the second portion is in the range from 0.05 pm to 0.2 pm,
   wherein the diffraction grating comprises raised portions corresponding to rings and recessed portions corresponding to grooves, said rings and grooves surrounding a center.

2. The optoelectronic device of claim 1, wherein the diffraction grating is capable of extracting the electromagnetic radiation from the second portion along a direction inclined by more than 10° relative to the direction perpendicular to the first part of the surface.

3. The optoelectronic device of claim 1, wherein a thickness of the first portion is greater than the thickness of the second portion.

4. The optoelectronic device of claim 1, wherein a lateral dimension of the second portion is greater than a wavelength of said electromagnetic radiation.

5. The optoelectronic device of claim 1, wherein said rings are circular.

6. The optoelectronic device of claim 1, wherein said rings are not circular.

7. The optoelectronic device of claim 1, wherein the rings have a shape of ellipses having a common focus and having a same major axis.

8. The optoelectronic device of claim 1, further comprising a layer of a material at least partly transparent to said electromagnetic radiation, covering at least the diffraction grating and having a refractive index at a wavelength of said electromagnetic radiation in the range from the refractive index of the third semiconductor layer at the wavelength of said electromagnetic radiation in the range from the refractive index of the third semiconductor layer at the wavelength of said electromagnetic radiation to the refractive index of air at the wavelength of said electromagnetic radiation.

9. The optoelectronic device of claim 1, wherein thickness h of the second portion verifies the following relation (I):

$$h < \frac{2\lambda}{\sqrt[3]{n_{GaN}^2 - n_{superstrat}^2}} \quad (I)$$

where $n_{GaN}$ is the refractive index, at the wavelength of the electromagnetic radiation emitted by the active area, of the material forming the second portion and $n_{superstrat}$ is the refractive index, at the wavelength of the electromagnetic radiation emitted by the active area, of the material in contact with the second portion by the second part of the surface.

10. The optoelectronic device of claim 1, wherein the diffraction grating is capable of extracting the electromagnetic radiation from the second portion along a direction substantially perpendicular to the first part to within 10°.

11. A method of manufacturing an optoelectronic device comprising an active area capable of supplying an electromagnetic radiation, sandwiched between first and second semiconductor layers, and comprising a third semiconductor layer, integrated to the first semiconductor layer or in contact with the first semiconductor layer, the third semiconductor layer delimiting a surface, the method comprising the steps of:
   a) forming, in the third semiconductor layer, a first portion at least partially covering the active area and delimiting a first part of the surface and being continued by a second portion delimiting a second part of the surface, the second portion forming a single-mode waveguide;
   b) forming a portion opaque to electromagnetic radiation, covering the first part of the surface; and
   c) forming a diffraction grating in the second part capable of extracting the electromagnetic radiation from the second portion
   wherein a thickness of the second portion is in a range from 0.05 µm to 0.2 µm,
   wherein the diffraction grating comprises raised portions corresponding to rings and recessed portions corresponding to grooves, said rings and grooves surrounding a center.

12. The method of claim 11, wherein step a) comprises forming a semiconductor stack and delimiting, in the semiconductor stack, the active area, the first portion, and the second portion by implantation of materials in the stack to locally degrade the stack.

13. An optoelectronic device comprising an active area capable of supplying an electromagnetic radiation and sandwiched between first and second semiconductor layers, the optoelectronic device comprising a third semiconductor layer, integrated to the first semiconductor layer or in contact with the first semiconductor layer, the third semiconductor layer delimiting a surface and comprising a first portion at least partially covering the active area and delimiting a first part of the surface and being continued by a second portion delimiting a second part of the surface, the second portion forming a single-mode waveguide, the optoelectronic device comprising an opaque portion which is reflective for electromagnetic radiation, covering the first part of the surface, and comprising a diffraction grating in the second part of the surface capable of extracting the electromagnetic radiation from the second portion;
   wherein the diffraction grating comprises rings;
   wherein the rings are not circular;
   wherein the rings have a shape of ellipses having a common focus and having a same major axis.

* * * * *

UNITED STATES PATENT AND TRADEMARK OFFICE
CERTIFICATE OF CORRECTION

PATENT NO. : 11,133,437 B2
APPLICATION NO. : 16/465723
DATED : September 28, 2021
INVENTOR(S) : François Templier et al.

It is certified that error appears in the above-identified patent and that said Letters Patent is hereby corrected as shown below:

In the Claims

In Claim 1, at Column 14, Line 35, after "0.05" delete "pm" and insert -- µm -- and after "0.2" delete "pm" and insert -- µm --.

Signed and Sealed this
Seventh Day of December, 2021

Drew Hirshfeld
*Performing the Functions and Duties of the
Under Secretary of Commerce for Intellectual Property and
Director of the United States Patent and Trademark Office*